(12) United States Patent
Kasashima et al.

(10) Patent No.: US 6,900,713 B2
(45) Date of Patent: May 31, 2005

(54) MAGNETIC SWITCH CAPABLE OF INSTANTANEOUS SWITCHING OF AN OUTPUT SIGNAL AND MAGNETIC SENSOR

(75) Inventors: Masao Kasashima, Miyagi-ken (JP);
Ichiro Tokunaga, Miyagi-ken (JP);
Hirofumi Okumura, Miyagi-ken (JP);
Seiji Kikuchi, Miyagi-ken (JP)

(73) Assignee: Alps Electric Co., Ltd., Tokyo (JP)

( * ) Notice: Subject to any disclaimer, the term of this patent is extended or adjusted under 35 U.S.C. 154(b) by 185 days.

(21) Appl. No.: 10/215,735

(22) Filed: Aug. 9, 2002

(65) Prior Publication Data

US 2003/0030522 A1 Feb. 13, 2003

(30) Foreign Application Priority Data

Aug. 13, 2001 (JP) ........................................ 2001-245487

(51) Int. Cl.⁷ .................................................. H01H 9/00
(52) U.S. Cl. ...................................... 335/207; 335/205
(58) Field of Search ................................ 335/202–207, 335/215

(56) References Cited

U.S. PATENT DOCUMENTS

| | | | | |
|---|---|---|---|---|
| 3,680,026 A | * | 7/1972 | Masuda et al. ........... 338/32 H |
| 3,768,095 A | * | 10/1973 | Lins et al. .................... 341/32 |
| 4,868,530 A | * | 9/1989 | Ahs ........................... 335/207 |
| 5,554,964 A | * | 9/1996 | Jansseune ................... 335/207 |
| 5,596,272 A | * | 1/1997 | Busch .................... 324/207.21 |
| 5,745,978 A | * | 5/1998 | Aboaf et al. ............. 29/603.08 |
| 5,960,523 A | * | 10/1999 | Husby et al. ................. 24/633 |
| 6,054,226 A | * | 4/2000 | Takeda et al. .............. 428/682 |
| 6,060,969 A | * | 5/2000 | Hufgard et al. ............. 335/207 |

FOREIGN PATENT DOCUMENTS

JP 2000-011827 1/2000

* cited by examiner

*Primary Examiner*—Lincoln Donovan
*Assistant Examiner*—Bernard Rojas
(74) *Attorney, Agent, or Firm*—Beyer, Weaver & Thomas LLP

(57) ABSTRACT

A magnetic switch using magnetoresistive elements having respective free layers whose magnetization directions are varied by an external magnetic field. The magnetic switch also has a first magnet and a second magnet that produce respective magnetic fields that serve as the external magnetic field and are different from each other in strength and opposite to each other in direction, and a magnetic shield member whose relative position with respect to the first magnet and the second magnet varies. The magnetic shield member moves between a first position with which both of the magnetic fields of the first magnet and the second magnet act on the magnetoresistive elements to magnetize their free layers in a first direction and a second position with which only one of the magnetic fields of the first magnet and the second magnet acts on the magnetoresistive elements to magnetize their free layers in a second direction that is opposite to the first direction.

6 Claims, 6 Drawing Sheets

| RESTORATION OF MAGNETIC FIELD BY RETREAT OF MAGNETIC SHIELD MEMBER (FIG.1) | SHIELDING FROM MAGNETIC FIELD BY MAGNETIC SHIELD MEMBER (FIG.2) |

MAGNETIC SWITCH CAPABLE OF INSTANTANEOUS SWITCHING OF AN OUTPUT SIGNAL AND MAGNETIC SENSOR

BACKGROUND OF THE INVENTION

1. Field of the Invention

The present invention relates to a magnetic switch and a magnetic sensor.

2. Description of the Related Art

A non-contact type magnetic switch using a magnetoresistive element are known. In this conventional non-contact type magnetic switch, a permanent magnet is disposed in the vicinity of a magnetoresistive element that exhibits the magnetoresistance effect and a magnetic field of the permanent magnet acts on the magnetoresistive element. Further, a shield plate for shielding the magnetoresistive element from the magnetic field of the permanent magnet is movably disposed between the magnetoresistive element and the permanent magnet.

The magnetoresistive element basically has a lamination structure that is composed of a free layer (free magnetic layer), a non-magnetic layer, a fixed layer (pinned magnetic layer), and an exchange bias layer (antiferromagnetic layer).

A bias magnetic field of the exchange bias layer acts on the fixed layer, whereby the fixed layer is magnetized and the magnetization direction is fixed to a particular direction. On the other hand, the magnetization direction of the free layer is varied by an external magnetic field.

In the above conventional non-contact type magnetic switch using a magnetoresistive element, the permanent magnet is used as a magnet for applying an external magnetic field to the free layer. The magnetization direction of the free layer is varied to a desired direction, that is, rotated with respect to the magnetization direction of the fixed layer, by the permanent magnet.

The magnetic shield plate for interrupting the magnetic field of the permanent magnet to act on the magnetoresistive element is inserted between or retreated from between the magnetoresistive element and the permanent magnet, whereby the strength of the magnetic field acting on the magnetoresistive element is varied and the magnitude of its resistance is thereby varied. A switch operation is performed based on an output signal that reflects a resistance variation of the magnetoresistive element.

However, in the conventional non-contact type switch, since the resistance of the magnetoresistive element varies in accordance with the strength of a magnetic field, that is, insertion or retreat of the shield plate, the resistance of the magnetoresistive element varies gradually as the shield plate approaches (goes into) the space between the magnetoresistive element and the permanent magnet or goes away (retreats) from the space. That is, the output signal of the magnetoresistive element (i.e., the resistance) varies slowly at the time of switching.

Therefore, the conventional non-contact type magnetic switch using a magnetoresistive element is not suitable for switch operations for, for example, instantaneous on/off switching and instantaneous detection of a movement of a member to be detected.

SUMMARY OF THE INVENTION

An object of the present invention is to provide a magnetic switch and a magnetic sensor in which an output signal of magnetoresistive elements is switched instantaneously by changing the resistances of magnetoresistive elements instantaneously in accordance with the direction of a magnetic field.

The present inventors have invented a magnetic switch and a magnetic sensor in which the magnetization directions of the fixed layers of at least two magnetoresistive elements are set opposed to each other and the free layers of the respective magnetoresistive elements are magnetized by two magnets and that switches an output signal instantaneously through rapid resistance variations of the magnetoresistive elements even with a configuration that the strength of a magnetic field varies gradually.

That is, to attain the above object, the invention provides a magnetic switch which performs switching of a switch using magnetoresistive elements having respective free layers whose magnetization directions are varied by an external magnetic field, characterized in that magnetic fields of a first magnet and a second magnet that are different from each other in strength and opposite to each other in direction are caused to selectively act, as an external field, on the magnetoresistive elements in response to a switching manipulation on the switch, whereupon the magnetoresistive elements produce a switching signal for a switch operation.

As one embodiment of the above magnetic switch, the invention provides a magnetic switch using magnetoresistive elements having respective free layers whose magnetization directions are varied by an external magnetic field, comprising a first magnet and a second magnet that produce respective magnetic fields that serve as the external magnetic field and are different from each other in strength and opposite to each other in direction; and a magnetic shield member whose relative position with respect to the first and second magnets is varied, wherein the magnetic shield member moves between a first position with which both of the magnetic fields of the first and second magnets act on the magnetoresistive elements to magnetize their free layers in a first direction and a second position with which only one of the magnetic fields of the first and second magnets acts on the magnetoresistive elements to magnetize their free layers in a second direction that is opposite to the first direction.

In this case, the magnetic field of the first magnet may be stronger than that of the second magnet, and the magnetization directions of the free layers may be determined by a direction of the magnetic field of the first magnet when the magnetic shield member is located at the first position and by a direction of the magnetic field of the second magnet when the magnetic shield member is located at the second position.

The invention can be implemented as not only the magnetic switch but also a magnetic sensor. The invention provides a magnetic sensor which detects a member to be detected using magnetoresistive elements having respective free layers whose magnetization directions are varied by an external magnetic field, characterized in that magnetic fields of a first magnet and a second magnet that are different from each other in strength and opposite to each other in direction are caused to selectively act, as an external field, on the magnetoresistive elements in accordance with a movement of the member to be detected, whereupon the magnetoresistive elements produce a detection signal indicating detection of the member to be detected.

As one embodiment of the above magnetic sensor, the invention provides a magnetic sensor which detects a member to be detected having a magnetic shield function by using magnetoresistive elements having respective free layers whose magnetization directions are varied by an external magnetic field, comprising a first magnet and a second magnet that produce respective magnetic fields that serve as the external magnetic field and are different from each other in strength and opposite to each other in direction, wherein a relative position of the member to be detected with respect to the first and second magnets varies; and wherein a first state in which both of the magnetic fields of the first and second magnets act on the magnetoresistive elements and a second state in which only one of the magnetic fields of the first and second magnets acts on the magnetoresistive elements are established as the relative position of the member to be detected with respect to the first and second magnets varies, whereby the member to be detected is detected.

In this case, the magnetic field of the first magnet may be stronger than that of the second magnet, and the magnetization directions of the free layers may be determined by a direction of the magnetic field of the first magnet when the member to be detected is in the first state and by a direction of the magnetic field of the second magnet when the member to be detected is in the second state.

The magnetoresistive elements that are used in the above magnetic switch or magnetic sensor may be two magnetoresistive elements that further have respective fixed layers whose magnetization directions are fixed and that are combined together in such a manner that the magnetization directions of the fixed layers are opposite to each other, and the two magnetoresistive elements may be connected to each other in series and incorporated in a bridge circuit or a voltage dividing circuit. A detection result of the magnetoresistive elements is output.

DESCRIPTION OF THE PREFERRED EMBODIMENTS

Embodiments of the present invention will be hereinafter described with reference to the accompanying drawings.

Figure 1:
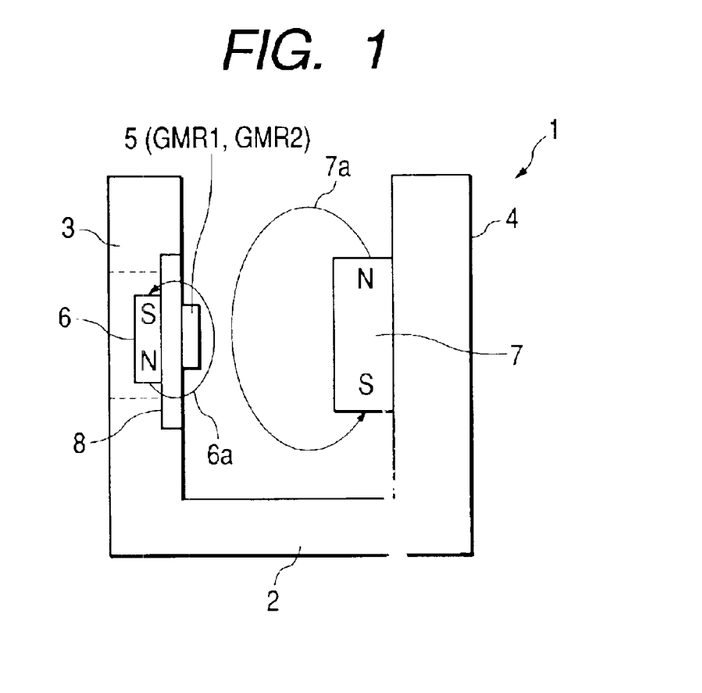
FIG. 1 is a front view of a magnetic switch according to an embodiment of the invention and shows a state that a magnetic shield member is retreated from the space between magnetoresistive elements and a first permanent magnet.
Figure 2:
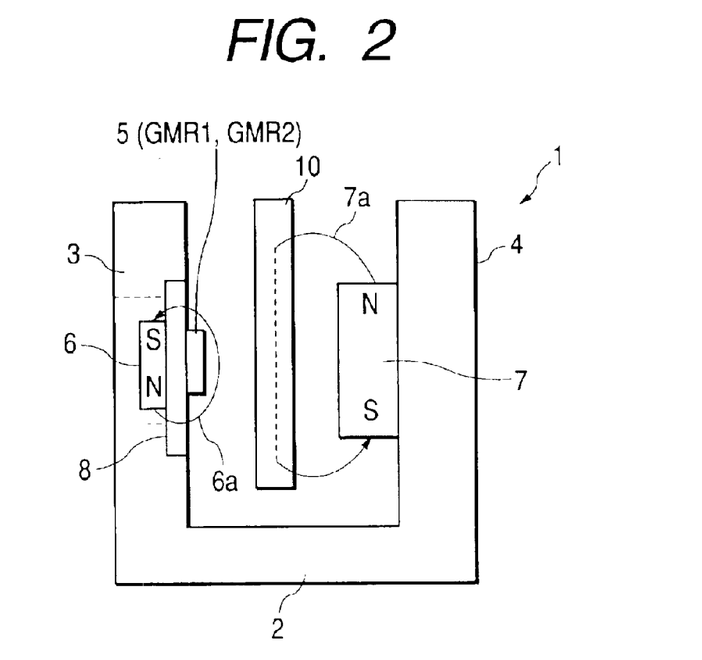
FIG. 2 is a front view of the magnetic switch according to the embodiment of the invention and shows a state that the magnetic shield member is inserted in the space between the magnetoresistive elements and the first permanent magnet.
Figure 3:
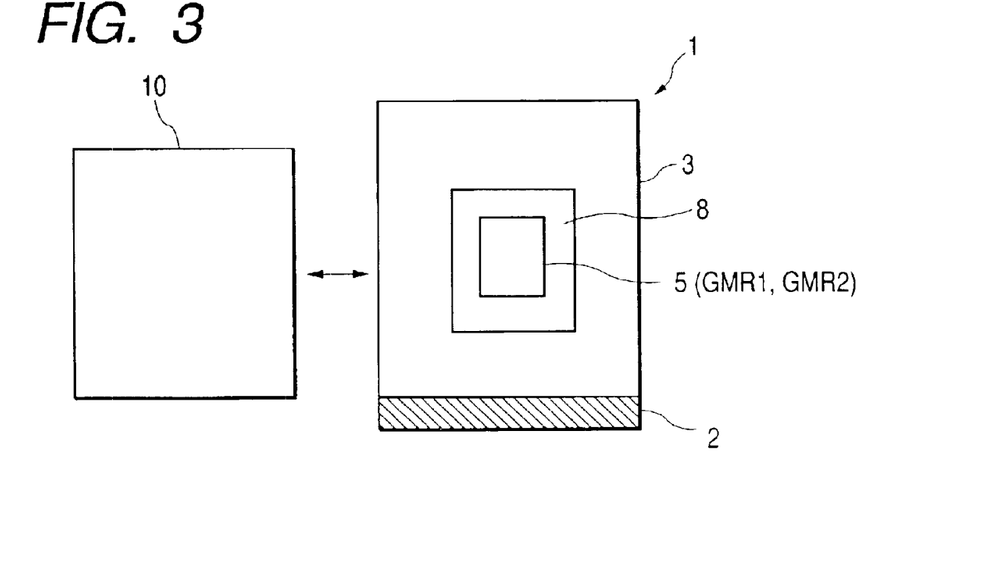
FIG. 3 is a side view of the magnetic switch according to the embodiment of the invention and shows how the magnetic shield member enters and retreats from the space between the magnetoresistive elements and the first permanent magnet.
Figure 4:
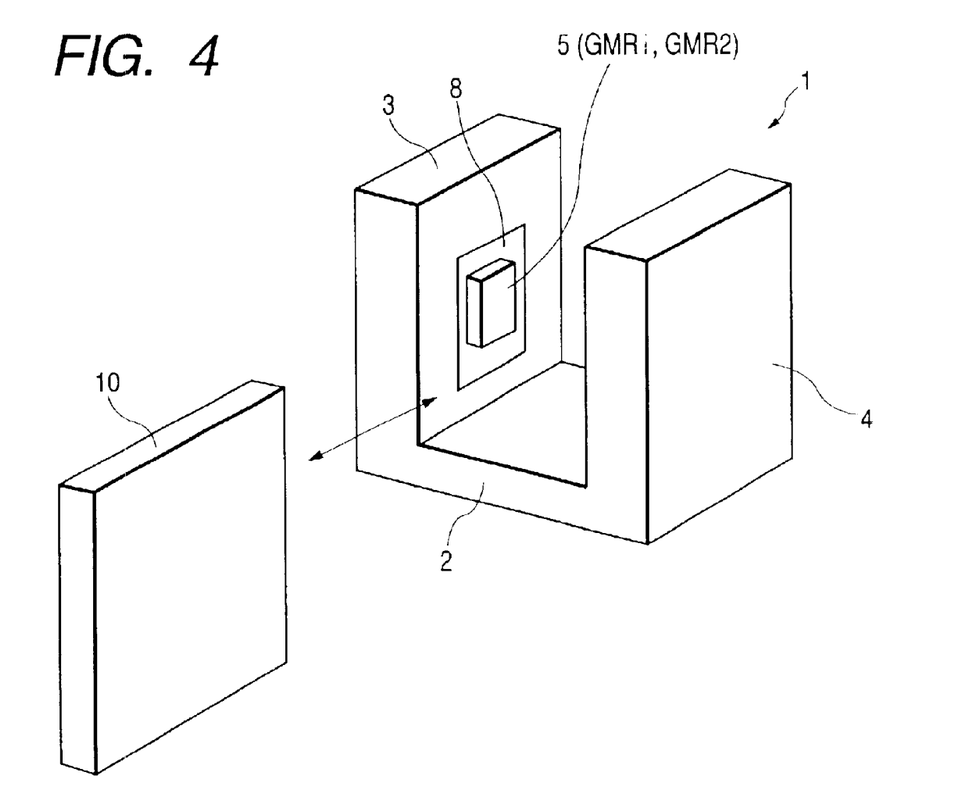
FIG. 4 is a perspective view of the magnetic switch according to the embodiment of the invention and shows how the magnetic shield member enters and retreats from the space between the magnetoresistive elements and the first permanent magnet.

As shown in FIGS. 1, 2, and 4, a holder 1 of a magnetic switch has an inverted gate shape in which a pair of arms 3 and 4 are provided at both ends of a base 2 so as to extend parallel with and be opposed to each other. The one arm 3 is provided with magnetoresistive elements 5 and a second permanent magnet (hereinafter referred to as "second magnet") 6, and the other arm 4 is provided with a first permanent magnet (hereinafter referred to as "first magnet") 7.

The magnetoresistive elements 5 are provided in a hermetic structure by using an IC package or resin sealing and mounted on a board 8. And the magnetoresistive elements 5 are attached to the inner surface of the arm 3 via the board 8.

The second magnet 6 is attached to the arm 3 at a magnetic field acting position where to magnetize free layers 5d (see FIG. 5) of the magnetoresistive elements 5. The magnetic field acting position is set at such a position that magnetic field lines 6a of the second magnet 6 act on the free layers 5d of the magnetoresistive elements 5 and hence the magnetic field (external magnetic field) of the second magnet 6 can magnetize the free layers 5d of the magnetoresistive elements 5. Although the second magnet 6 shown in FIGS. 1, 2, and 4 is separate from the magnetoresistive elements 5, it may be integrated with the magnetoresistive elements 5.

The first magnet 7 is attached to the arm 4 in such a manner that the first magnet 7 is located at such a position (magnetic field acting position) that its magnetic field (external magnetic field) can act on and magnetize the free layers 5d of the magnetoresistive elements 5, and that magnetic field lines (the direction of the magnetic field) 7a of the first magnet 7 are parallel with and opposite in direction to the magnetic field lines (the direction of the magnetic field) 6a of the second magnet 6 (180° is formed). The first magnet 7 is a magnet that produces a magnetic field that is stronger by hundreds of gausses than that produced by the second magnet 6.

Next, the magnetoresistive elements 5 that are used in the magnetic switch will be described in a specific manner with reference to FIG. 5. This exemplary structure is of a case that the second magnet 6 is provided separately from the magnetoresistive elements 5. Each magnetoresistive element 5 has a basic configuration in which an exchange bias layer (antiferromagnetic layer) 5a, a fixed layer (pinned magnetic layer) 5b, a non-magnetic layer 5c, and a free layer (free magnetic layer) 5d are laminated, and is a kind of GMR (giant magnetoresistive) element that utilizes the giant magnetoresistance effect.

For the magnetoresistive element 5 to exhibit a giant magnetoresistance effect, an $\alpha\text{-Fe}_2\text{O}_3$ layer, an NiFe layer, a Cu layer, and an NiFe layer, for example, are employed as the exchange bias layer 5a, the fixed layer 5b, the non-magnetic layer 5c, and the free layer 5d, respectively. However, the invention is not limited to such a case and any materials can be employed as long as they allow the magnetoresistive element 5 to exhibit a giant magnetoresistance effect. Further, the structure of the magnetoresistive element 5 is not limited to the above lamination structure as long as it exhibits a giant magnetoresistance effect.

Figure 5:
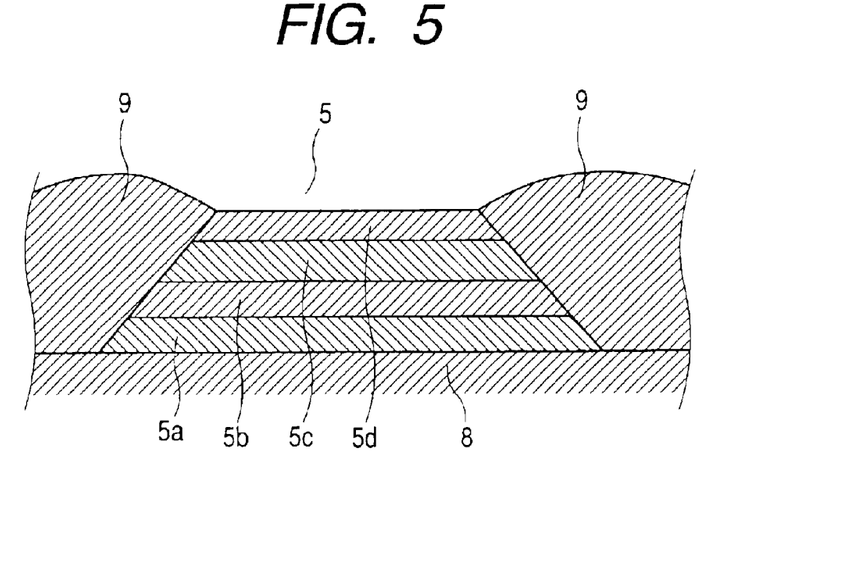
FIG. 5 is a sectional view showing an exemplary magnetoresistive element used in the magnetic switch according to the embodiment of the invention.

The fixed layer 5b of the magnetoresistive element 5 shown in FIG. 5 is magnetized by the exchange bias layer 5a and its magnetization direction is fixed (pinned) in a particular direction by the exchange bias layer 5a. The magnetization direction of the free layer 5d with respect to that of the fixed layer 5b is varied by the magnetic fields of the magnets 6 and 7 (external magnetic field). Terminal layers 9 are joined to both sides of the magnetoresistive element 5. A variation in the resistance between the two terminal layers 9 is output, the variation depending on the direction of magnetization, caused by an external magnetic field, of the free layer 5d with respect to the fixed magnetization direction of the fixed layer 5b.

The fixed layers 5b of the magnetoresistive elements 5 are magnetized in such a manner that their magnetization direction is fixed to a particular direction. The first magnet 7 is a magnet that produces a magnetic field that is stronger than that produced by the second magnet 6. And the free layers 5d of the magnetoresistive elements 5 are magnetized by the first magnet 7 and the second magnet 6 in opposite directions (180° is formed). In this embodiment, the free layers 5d are magnetized by the second magnet 6 in the same direction as and in the opposite direction (180° is formed) to the magnetization directions of the fixed layers 5b, respectively.

The magnetic switch further has a magnetic shield member 10 made of a ferromagnetic material whose relative position with respect to the first magnet 7 and the second magnet 6 is changed. The magnetic shield member 10 is moved between a first position with which both of the magnetic fields of the first magnet 7 and the second magnet 6 are allowed to act on the magnetoresistive elements 5 to magnetize their free layers 5d in a first direction and a second position with which one of the magnetic fields of the first magnet 7 and the second magnet 6 is allowed to act on the magnetoresistive elements 5 to magnetize their free layers 5d in a second direction that is opposite to the first direction.

In the example of FIGS. 1–4, the magnetic shield member 10 is provided so as to be able to enter and retreat from the space between the first magnet 7 and the magnetoresistive elements 5 by going between the paired arms 3 and 4 that are parallel with each other. In this embodiment, the plate-like magnetic shield member 10 is caused to enter or retreat from the space between the first magnet 7 and the magnetoresistive elements 5 by making a linear movement that is perpendicular to the line connecting the first magnet 7 and the magnetoresistive elements 5 while being guided by a guide (not shown). Alternatively, a fan-shaped magnetic shield member 10 may be caused to enter or retreat from the space between the first magnet 7 and the magnetoresistive elements 5 by making a rotational movement in a plane that is perpendicular to the line connecting the first magnet 7 and the magnetoresistive elements 5.

In this embodiment, the first position is a position to which the magnetic shield member 10 retreats from between the first magnet 7 and the magnetoresistive elements 5. On the other hand, the second position is a position where the magnetic shield member 10 resides when having entered the space between the first magnet 7 and the magnetoresistive elements 5.

When the magnetic shield member 10 has been moved to the second position by a driving means (not shown), the magnetic shield member 10 makes the magnetic field lines 7a go away from the free layers 5d of the magnetoresistive elements 5 to shield those from the magnetic field of the first magnet 7 and allows only the magnetic field of the second magnet 6 to act as external magnetic field on the magnetoresistive elements 5. Therefore, only the magnetic field of the second magnet 6 that is weaker than that of the first magnet 7 acts, as an external magnetic field, on the free layers 5d of the magnetoresistive elements 5.

On the other hand, when the magnetic shield member 10 has been moved to the first position, both of the magnetic fields of the first magnet 7 and the second magnet 6 act on the magnetoresistive elements 5 as external magnetic fields. The magnetic field of the first magnet 7 is stronger than that of the second magnet 6 and the first magnet 7 and the second magnet 6 have the functions of magnetizing the free layers 5d of the magnetoresistive elements 5 in opposite directions (180° is formed). Therefore, the magnetic field of the second magnet 6 is canceled out by that of the first magnet 7 and the magnetic field of the first magnet 7 dominantly acts on the free layers 5d of the magnetoresistive elements 5, whereby the magnetization direction of the free layers 5d of the magnetoresistive elements 5 is reversed so as to become opposite to the direction of magnetization that has been caused by the second magnet 6 (180° is formed)

The resistances of the magnetoresistive elements 5 vary as the magnetization direction of the free layers 5d of the magnetoresistive elements 5 is reversed depending on which of the magnetic fields of the first magnet 7 and the second magnet 6 acts (dominantly). When the magnetization direction of the free layers 5d is reversed, the fixed layers 5b of the magnetoresistive element 5 are magnetized in opposite directions (180° is formed). Therefore, resistance variations occur instantaneously.

Figure 6A:
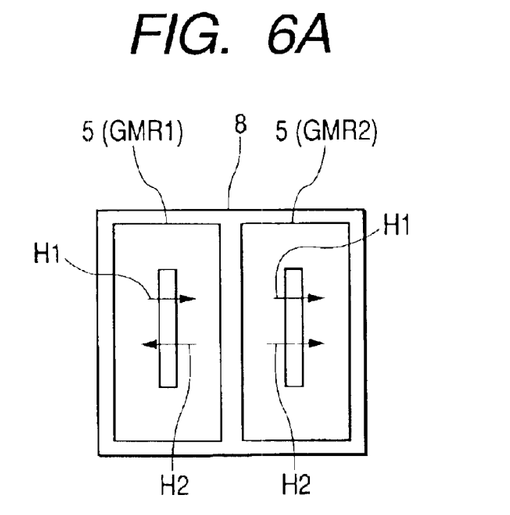
FIGS. 6A and 6B show magnetization directions of the magnetoresistive elements used in the magnetic switch according to the embodiment of the invention.
Figure 6B:
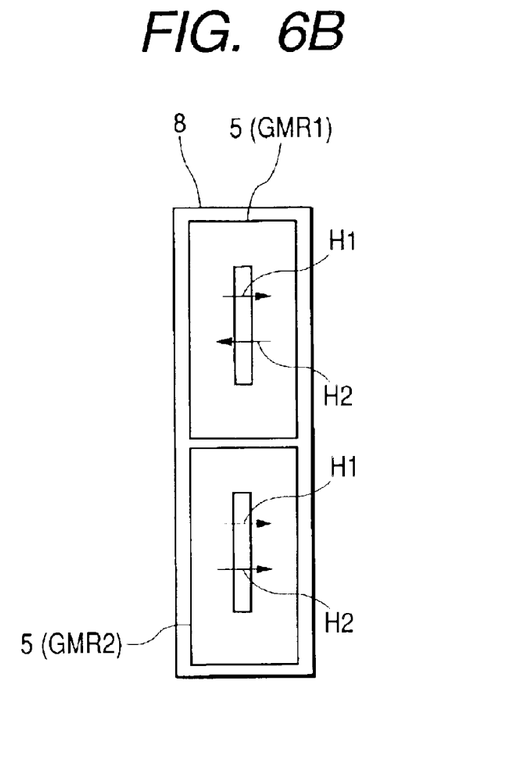

In this embodiment, at least two magnetoresistive elements 5 shown in FIG. 5 are used and the resistances of the magnetoresistive elements 5 that vary instantaneously in accordance with the magnetic field direction are output as an output signal. The two magnetoresistive elements 5 are formed on the board 8 so as to be arranged in the lateral direction as shown in FIG. 6A. Alternatively, they are formed on the board 8 so as to be arranged in the longitudinal direction as shown in FIG. 6B.

The magnetization directions H2 of the fixed layers 5b of the two magnetoresistive elements 5 that are formed on the board 8 are opposite to each other (180° is formed), and the magnetization directions H1 of the free layers 5d are equalized by the second magnet 6. In the examples of FIGS. 6A and 6B, the magnetization direction H1 of the free layer 5d of one magnetoresistive element (GMR 1) is opposite (180° is formed) to that of the magnetization direction H2 of its fixed layer 5b. The magnetization direction H1 of the free layer 5d of the other magnetoresistive element (GMR 2) is the same as the magnetization direction H2 of its fixed layer 5b.

A description will be made with reference to FIG. 7 with a notation that terminal layers at both ends of each magnetoresistive element 5 are denoted by 9a and 9b and the respective magnetoresistive elements are denoted by GMR1 and GMR2. The two magnetoresistive elements GMR1 and GMR2 are connected to each other in series by connecting the terminal layer 9a of the magnetoresistive element GMR2 to the terminal layer 9b of the magnetoresistive element GMR1.

Figure 7:
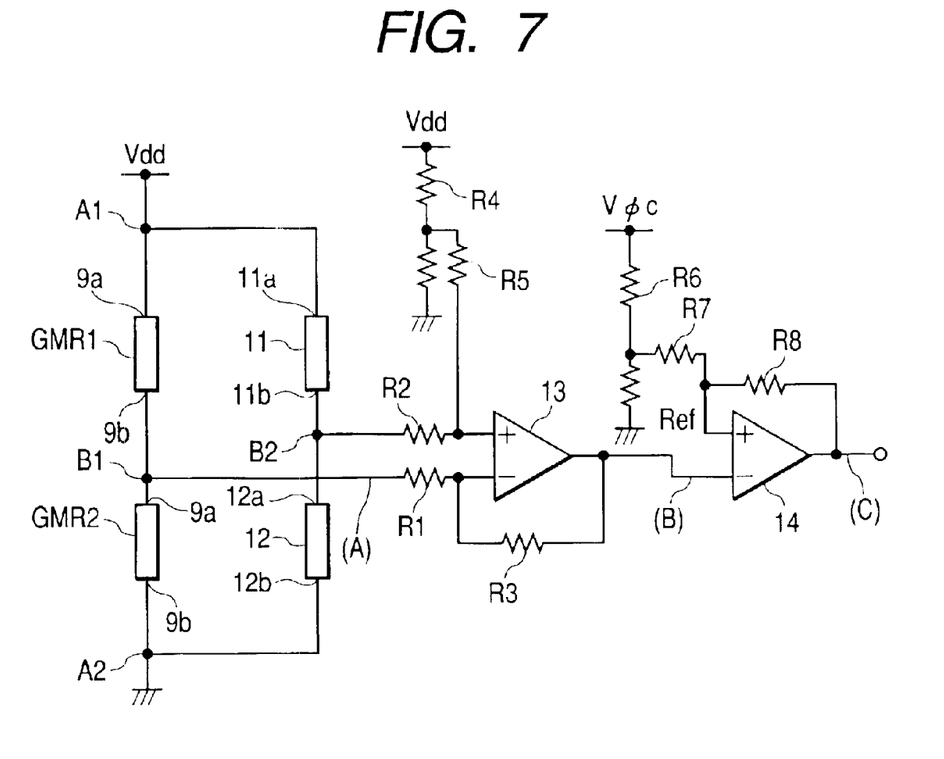
FIG. 7 is a circuit diagram of a circuit in which the magnetoresistive elements used in the magnetic switch according to the embodiment of the invention are incorporated in a bridge circuit.

A bridge circuit shown in FIG. 7 is formed in such a manner that the two magnetoresistive elements GMR1 and GMR2 are used in the two respective sides and two fixed resistors 11 and 12 are used in the remaining two sides, respectively. More specifically, the terminal layer 9a of the magnetoresistive element GMR1 is connected to a terminal 11a of the fixed resistor 11, and their connecting point A1 is connected to a terminal Vdd of a voltage source. The terminal layer 9b of the magnetoresistive element GMR2 is connected to a terminal 12b of the fixed resistor 12, and their connecting point A2 is connected to a ground terminal of the voltage source. The two fixed resistors 11 and 12 may be replaced by two magnetoresistive elements.

The terminal layer 9b of the magnetoresistive element GMR1 is connected to the terminal layer 9a of the magnetoresistive element GMR2, and their connecting point B1 is connected to one input terminal of a comparator 13 via a fixed resistor R1. The terminal 11b of the fixed resistor 11 is connected to the terminal 12a of the fixed resistor 12, and their connecting point B2 is connected to the other input terminal of the comparator 13 via a fixed resistor R2.

A feedback fixed resistor R3 is provided between the one input terminal and the output terminal of the comparator 13. The terminal Vdd of the voltage source is connected to the other input terminal of the comparator 13 via a variable resistor R4 and a fixed resistor R5.

The output terminal of the comparator 13 is connected to one input terminal of a comparator 14. A terminal Vφc of another voltage source is connected to the other input terminal of the comparator 14 via a voltage dividing resistor R6 and a fixed resistor R7, whereby the voltage of the other input terminal of the comparator 14 is set at a reference voltage Ref. In this embodiment, the reference voltage Ref is set at 2.5 V. A feedback fixed resistor R8 is provided between the one other input terminal and the output terminal of the comparator 14.

The operation of the magnetic switch will be described below with an assumption that the state that the magnetic shield member 10 has entered the space between the magnetoresistive elements GMR1 and GMR2 (5) and the first magnet 7 (see FIG. 2) corresponds to switch on and the state that the magnetic shield member 10 has retreated from between the magnetoresistive elements GMR1 and GMR2 (5) and the first magnet 7 (see FIG. 1) corresponds to switch off. It is also assumed that the magnetization directions of the fixed layers 5b and the free layers 5d of the two respective magnetoresistive elements GMR1 and GMR2 have the relationship shown in FIG. 6A.

Figure 8A:
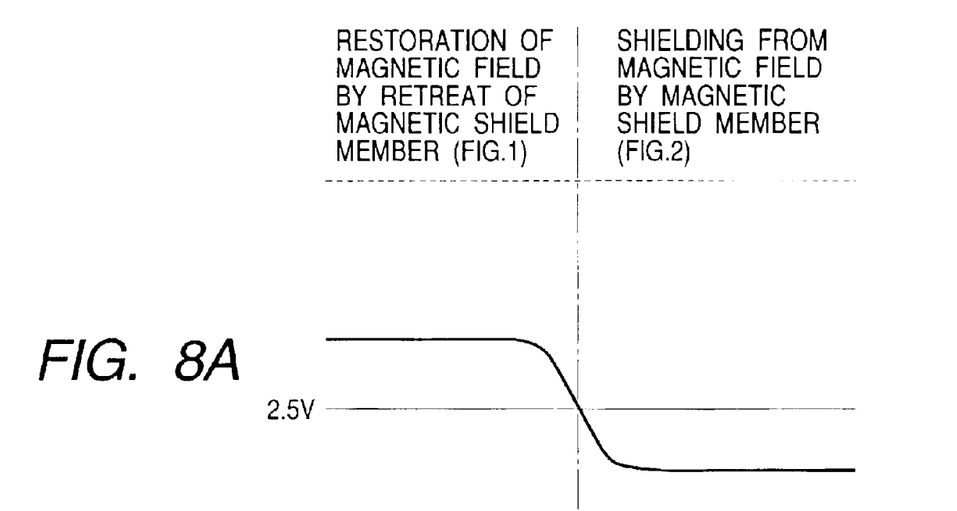
FIGS. 8A–8C show output signal waveforms at respective points of the bridge circuit.

In the case of switch off, the magnetic shield member 10 retreats from between the magnetoresistive elements GMR1 and GMR2 and the first magnet 7 as shown in FIG. 1 and hence the magnetic field of the first magnet 7 acts on the magnetoresistive elements GMR1 and GMR2. In this case, since the magnetic field of the first magnet 7 is stronger than that of the second magnet 6, the magnetization direction of the free layers of the magnetoresistive elements GMR1 and GMR2 becomes the same as the direction of the magnetic field lines 7a of the first magnet 7. Therefore, the magnetization direction of the free layer of the magnetoresistive element GMR1 becomes the same as that of its fixed layer and the magnetization direction of the free layer of the magnetoresistive element GMR2 becomes opposite to that of its fixed layer (180° is formed). The resistance $R_{GMR2}$ of the magnetoresistive element GMR2 becomes greater than the resistance $R_{GMR1}$ of the magnetoresistive element GMR1 ($R_{GMR1} < R_{GMR2}$). As shown in FIG. 8A, the voltage at the connecting point B1 of the two magnetoresistive elements GMR1 and GMR2 becomes higher than 2.5 V.

In the case of switch on, the magnetic shield member 10 enters the space between the magnetoresistive elements GMR1 and GMR2 and the first magnet 7 as shown in FIG. 2, and hence the magnetoresistive elements GMR1 and GMR2 are shielded from the magnetic field of the first magnet 7 and only the magnetic field of the second magnet 6 acts on the magnetoresistive elements GMR1 and GMR2. In this case, the magnetization direction of the free layers of the magnetoresistive elements GMR1 and GMR2 becomes the same as the direction of the magnetic field lines 6a of the second magnet 6. Therefore, the magnetization direction of the free layer of the magnetoresistive element GMR1 becomes opposite to that of its fixed layer (180° is formed) and the magnetization direction of the free layer of the magnetoresistive element GMR2 becomes the same as that of its fixed layer. The resistance $R_{GMR1}$ of the magnetoresistive element GMR1 becomes greater than the resistance $R_{GMR2}$ of the magnetoresistive element GMR2 ($R_{GMR2} < R_{GMR1}$). As shown in FIG. 8A, the voltage at the connecting point B1 of the two magnetoresistive elements GMR1 and GMR2 becomes lower than 2.5 V.

Figure 8B:
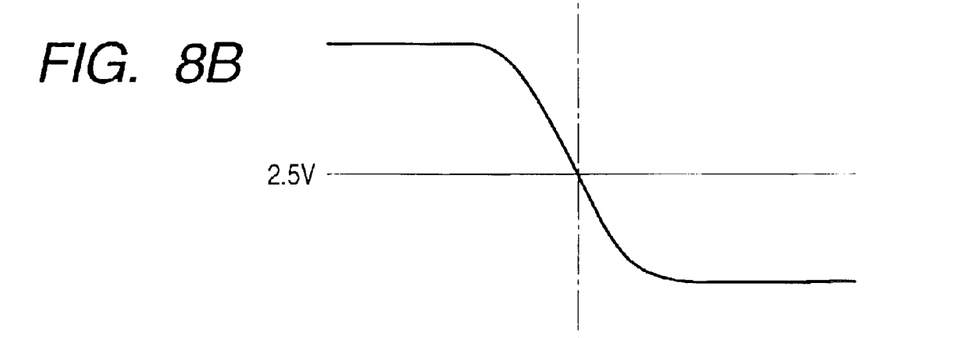
Figure 8C:
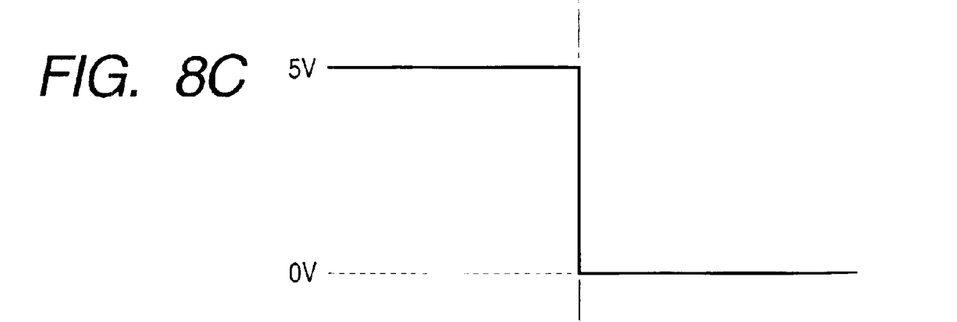

As shown in FIG. 8B, an amplified voltage of the voltage at the connecting point B1 appears at the output of the comparator 13. The amplified voltage is compared with the reference voltage Ref for the comparator 14. As shown in FIG. 8C, at the output of the comparator 14, an output signal of 5 V appears in the case of switch off and an output signal of 0 V appears in the case of switch on. In this manner, resistance variations of the magnetoresistive elements GMR1 and GMR2 are output as a voltage variation.

In the magnetic switch according to this embodiment, the magnetic fields of the first magnet 7 and the second magnet 6 that are different from each other in strength and opposite to each other in direction are caused to selectively operation, as an external magnetic field, on the magnetoresistive elements 5 in response to a switching manipulation on the switch, whereupon the magnetoresistive elements 5 produce a switching signal for a switch operation. The switch is switched based on the switching signal. By moving the magnetic shield member 10, the direction of the magnetic field to act on the magnetoresistive elements 5 (i.e., the direction in which to magnetize the free layers of the magnetoresistive elements 5) can be changed between opposite directions (180° is formed). Therefore, even with the configuration in which the strength of the magnetic field varies slowly, the resistances of the magnetoresistive elements 5 can be changed rapidly. A switch operation can be performed quickly based on such rapid resistance variations.

Since the at least two magnetoresistive elements GMR1 and GMR2 that are connected to each other in series are incorporated in the bridge circuit as shown in FIG. 7, the switch can be switched accurately and reliably without being influenced by noise as caused by an external noise magnetic field, an environmental magnetic field, or the like.

Figure 9:
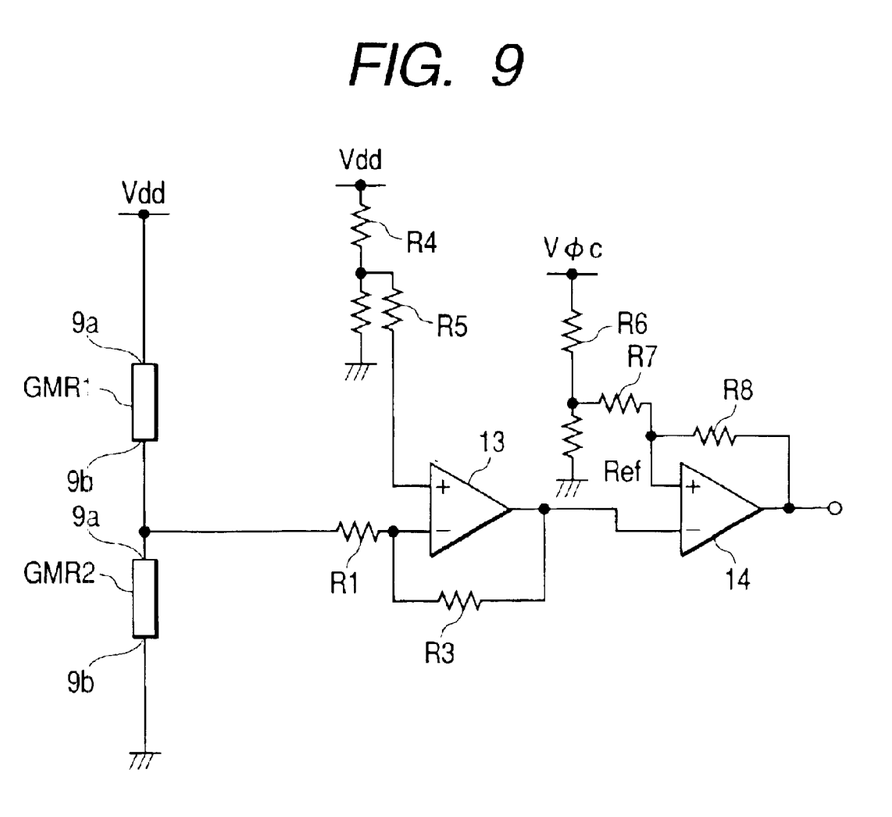
FIG. 9 is a circuit diagram of a circuit in which the magnetoresistive elements used in the magnetic switch according to the embodiment of the invention are incorporated in a voltage dividing circuit.

Although in FIG. 7 the at least two magnetoresistive elements GMR1 and GMR2 that are connected to each other in series are incorporated in the bridge circuit, the invention is not limited to such a case. As shown in FIG. 9, magnetoresistive elements GMR1 and GMR2 that are connected to each other in series may be incorporated in a voltage dividing circuit.

To incorporate magnetoresistive elements GMR1 and GMR2 that are connected to each other in series in a voltage dividing circuit, a terminal Vdd of a voltage source is connected to the terminal layer 9a of the magnetoresistive element GMR1 and a ground terminal of the voltage source is connected to the terminal layer 9b of the magnetoresistive element GMR2. The terminal layer 9b of the magnetoresistive element GMR1 is connected to the terminal layer 9a of the magnetoresistive element GMR2, and their connecting point B1 is connected to one input terminal of a comparator 13 via a fixed resistor R1. The other part of the configuration that relates to the comparators 13 and 14 is the same as shown in FIG. 7.

In the case of switch off, the magnetic shield member 10 retreats from between the magnetoresistive elements GMR1 and GMR2 and the first magnet 7 as shown in FIG. 1 and hence the magnetic field of the first magnet 7 acts on the magnetoresistive elements GMR1 and GMR2. In this case, since the magnetic field of the first magnet 7 is stronger than that of the second magnet 6, the magnetization direction of the free layers of the magnetoresistive elements GMR1 and GMR2 becomes the same as the direction of the magnetic field lines 7a of the first magnet 7. Therefore, the magnetization direction of the free layer of the magnetoresistive element GMR1 becomes the same as that of its fixed layer and the magnetization direction of the free layer of the magnetoresistive element GMR2 becomes opposite to that of its fixed layer (180° is formed). The resistance $R_{GMR2}$ of the magnetoresistive element GMR2 becomes greater than the resistance $R_{GMR1}$ of the magnetoresistive element GMR1 ($R_{GMR1} < R_{GMR2}$) As shown in FIG. 8A, the voltage at the connecting point B1 of the two magnetoresistive elements GMR1 and GMR2 becomes higher than 2.5 V.

In the case of switch on, the magnetic shield member 10 enters the space between the magnetoresistive elements GMR1 and GMR2 and the first magnet 7 as shown in FIG. 2, and hence the magnetoresistive elements GMR1 and GMR2 are shielded from the magnetic field of the first magnet 7 and only the magnetic field of the second magnet 6 acts on the magnetcresistive elements GMR1 and GMR2. In this case, the magnetization direction of the free layers of the magnetoresistive elements GMR1 and GMR2 becomes the same as the direction of the magnetic field lines 6a of the second magnet 6. Therefore, the magnetization direction of the free layer of the magnetoresistive element GMR1 becomes opposite to that of its fixed layer (180° is formed) and the magnetization direction of the free layer of the magnetoresistive element GMR2 becomes the same as that of its fixed layer. The resistance $R_{GMR1}$ of the magnetoresistive element GMR1 becomes greater than the resistance $R_{GMR2}$ of the magnetoresistive element GMR2 ($R_{GMR2} < R_{GMR1}$). As shown in FIG. 8A, the voltage at the connecting point B1 of the two magnetoresistive elements GMR1 and GMR2 becomes lower than 2.5 V.

As shown in FIG. 8B, an amplified voltage of the voltage at the connecting point B1 appears at the output of the comparator 13. The amplified voltage is compared with the reference voltage Ref for the comparator 14. As shown in FIG. 8C, at the output of the comparator 14, an output signal of 5 V appears in the case of switch off and an output signal of 0 V appears in the case of switch on. In this manner, resistance variations of the magnetoresistive elements GMR1 and GMR2 are output as a voltage variation.

With the magnetic switch according to this embodiment, since the magnetoresistive elements that are connected to each other in series constitute the voltage dividing circuit, the configuration of the circuit for picking up resistance variations of the magnetoresistive elements as a voltage variation can be simplified.

Whether to use the above voltage dividing circuit or bridge circuit may be determined in accordance with the subject of the switch operation.

Although the above description is directed to the case that the magnetic switch is formed, the invention is not limited to such a case. A magnetic sensor can be constructed that uses magnetoresistive elements having respective free layers whose magnetization directions are varied by an external magnetic field, and that detects a member to be detected having a magnetic shield function.

This magnetic sensor is different from the magnetic switch in that the magnetic shield member 10 of the magnetic switch is used as a member to be detected having a magnetic shield function and that the member (10) to be detected is detected. The configuration of the magnetic sensor is the same as the magnetic switch in the other points.

The member (10) to be detected moves in such a manner that its relative position with respect to the first magnet 7 and the second magnet 6 varies. As the relative position of the member (10) to be detected varies with respect to the first magnet 7 and the second magnet 6, there occur a first state in which both of the magnetic fields (external magnetic fields) of the first magnet 7 and the second magnet 6 act on the magnetoresistive elements 5 and a second state in which only one of the magnetic fields (external magnetic fields) of the first magnet 7 and the second magnet 6 acts on the magnetoresistive elements 5, whereby the member (10) to be detected is detected.

A state that the magnetic shield member 10 has retreated from between the first magnet 7 and, the magnetoresistive elements 5 is employed as the first state. On the other hand, a state that the magnetic shield 10 has entered the space between the first magnet 7 and the magnetoresistive elements 5. In the second state, the member (10) to be detected shields the magnetoresistive elements 5 from the magnetic field of the first magnet 7 that is stronger than that of the second magnet 6 and hence only the magnetic field of the second magnet 6 acts on the magnetoresistive elements 5 as an external magnetic field.

In this magnetic sensor, the magnetic fields of the first magnet 7 and the second magnet 6 that are different from each other in strength and opposite to each other in direction are caused to selectively act, as an external field, on the magnetoresistive elements 5 in accordance with a movement of the member (10) to be detected. The magnetoresistive elements 5 outputs a detection signal indicating detection of the member (10) to be detected, based on which the member (10) to be detected is detected. As the member (10) to be detected moves, the direction of the magnetic field to act on the magnetoresistive elements 5 (i.e., the direction in which to magnetize the free layers of the magnetoresistive elements 5) can be changed between opposite directions (180° is formed). Therefore, even with the configuration in which the strength of the magnetic field varies slowly, the resistances of the magnetoresistive elements 5 can be changed rapidly. The member (10) to be detected can be detected quickly based on such rapid resistance variations.

As described above, according to the invention, the magnetic fields of the first magnet and the second magnet that are different from each other in strength and opposite to each other in direction are caused to selectively act, as an external field, on the magnetoresistive elements. The magnetoresistive elements produces an output signal that correspond to rapid resistance variations, based on which a switch operation or detection of the member to be detected can be performed quickly.

What is claimed is:

1. A magnetic switch which performs switching using a magnetoresistive element having a free layer whose direction of magnetization is changed by an external magnetic field, the magnetic switch comprising:
   a first magnet;
   a second magnet for producing a magnetic field that is stronger than and opposite in direction to a magnetic field produced by the first magnet; and a magnetic shield member movably disposed between the first magnet and the second magnet, wherein the magnetoresistive element is disposed adjacent to the first magnet, and the second magnet is disposed at a longer distance from the magnetoresistive element than the first magnet, wherein a switching signal for a switch operation is output by operating the magnetoresistive element to determine the direction of magnetization of the free layer by the direction of the magnetic field of the second magnet when the magnetic shield member is not placed between the first magnet and the second magnet, and by operating the magnetoresistive element to determine the direction of magnetization of the free layer by the direction of the magnetic field of the first magnet when the magnetic shield member is placed between the first magnet and the second magnet.

2. The magnetic switch according to claim 1, characterized in:

that the magnetoresistive elements are two magnetoresistive elements that further have respective fixed layers whose magnetization directions are fixed and that are combined together in such a manner that the magnetization directions of the fixed layers are opposite to each other; and that the two magnetoresistive elements are connected to each other in series and incorporated in a bridge circuit.

3. The magnetic switch according to claim 1, characterized in:

that the magnetoresistive elements are two magnetoresistive elements that further have respective fixed layers whose magnetization directions are fixed and that are combined together in such a manner that the magnetization directions of the fixed layers are opposite to each other; and that the two magnetoresistive elements are connected to each other in series and constitute a voltage dividing circuit.

4. A magnetic sensor which detects a member to be detected by using a magnetoresistive element having a free layer whose direction of magnetization is changed by an external magnetic field, the magnetic sensor comprising:

a first magnet;

a second magnet for producing a magnetic field that is stronger than and opposite in direction to a magnetic field produced by the first magnet; and a magnetic shield member movably disposed between the first magnet and the second magnet, wherein the magnetoresistive element is disposed adjacent to the first magnet, and the second magnet is disposed at a longer distance from the magnetoresistive element than the first magnet, wherein a detection signal indicating detection of the member to be detected is output by operating the magnetoresistive element to determine the direction of magnetization of the free layer by the direction of the magnetic field of the second magnet when the magnetic shield member is not placed between the first magnet and the second magnet, and by operating the magnetoresistive element to determine the direction of magnetization of the free layer by the direction of the magnetic field of the first magnet when the magnetic shield member is placed between the first magnet and the second magnet.

5. The magnetic sensor according to claim 4, characterized in:

that the magnetoresistive elements are two magnetoresistive elements that further have respective fixed layers whose magnetization directions are fixed and that are combined together in such a manner that the magnetization directions of the fixed layers are opposite to each other; and that the two magnetoresistive elements are connected to each other in series and incorporated in a bridge circuit.

6. The magnetic sensor according to claim 4, characterized in:

that the magnetoresistive elements are two magnetoresistive elements that further have respective fixed layers whose magnetization directions are fixed and that are combined together in such a manner that the magnetization directions of the fixed layers are opposite to each other; and that the two magnetoresistive elements are connected to each other in series and constitute a voltage dividing circuit.

* * * * *